United States Patent
Joshkin et al.

(10) Patent No.: US 8,598,813 B2
(45) Date of Patent: Dec. 3, 2013

(54) HIGH VOLTAGE RF OPTO-ELECTRIC MULTIPLIER FOR CHARGE PARTICLE ACCELERATIONS

(75) Inventors: Vladimir Andreevich Joshkin, Dublin, CA (US); Antonios Zografos, Oakland, CA (US)

(73) Assignee: Compact Particle Acceleration Corporation, Livermore, CA (US)

( * ) Notice: Subject to any disclaimer, the term of this patent is extended or adjusted under 35 U.S.C. 154(b) by 0 days.

(21) Appl. No.: 13/352,187

(22) Filed: Jan. 17, 2012

(65) Prior Publication Data

US 2013/0181637 A1   Jul. 18, 2013

(51) Int. Cl.
*H05H 9/00* (2006.01)

(52) U.S. Cl.
USPC ............. 315/505; 315/32; 315/33; 315/39; 315/209 R; 331/96; 307/106

(58) Field of Classification Search
USPC ......... 315/506, 505, 504, 503, 502, 501, 500, 315/32, 39, 209 R; 331/96; 307/106
See application file for complete search history.

(56) References Cited

U.S. PATENT DOCUMENTS

| | | | |
|---|---|---|---|
| 2,465,840 A | 8/1944 | Blumlein | |
| 2,825,760 A | 3/1958 | Clogston | |
| 4,441,091 A | 4/1984 | Nishida et al. | |
| 5,497,050 A * | 3/1996 | Cheo | 315/5.41 |
| 5,511,944 A | 4/1996 | Ide et al. | |
| 5,757,146 A | 5/1998 | Carder | |
| 5,811,944 A * | 9/1998 | Sampayan et al. | 315/505 |
| 5,821,705 A * | 10/1998 | Caporaso et al. | 315/507 |
| 6,239,671 B1 | 5/2001 | Smith | |
| 6,320,334 B1 * | 11/2001 | Roberge et al. | 315/505 |
| 6,573,813 B1 | 6/2003 | Joannopoulos et al. | |
| 7,173,385 B2 | 2/2007 | Caporaso et al. | |
| 7,174,485 B2 | 2/2007 | Silvus | |
| 7,649,328 B2 * | 1/2010 | Smirnov et al. | 315/505 |
| 7,679,297 B1 * | 3/2010 | Stygar et al. | 315/505 |

(Continued)

FOREIGN PATENT DOCUMENTS

| | | |
|---|---|---|
| EP | 2099131 A2 | 9/2009 |
| WO | WO 2008/033149 | 3/2008 |
| WO | WO 2010/121179 | 10/2010 |
| WO | WO 2010/129804 | 11/2010 |

OTHER PUBLICATIONS

U.S. Appl. No. 61/680,782 entitled Improvements for High Voltage Opto-Electric Switch filed Aug. 8, 2012, 13 pages.

(Continued)

*Primary Examiner* — Daniel Cavallari
*Assistant Examiner* — Srinivas Sathiraju
(74) *Attorney, Agent, or Firm* — Davis Wright Tremaine LLP

(57) ABSTRACT

Circuitry is presented for use in the pulse-forming lines of compact linear accelerators of charged particles. This presents devices that can provide high-voltage radio-frequency pulses in the range of from a few volts to megavolts for charged particle accelerators. The devices can use as input an external charge voltage and an optical pulse to create output RF pulses with a peak voltage that is increased over the input voltage. The exemplary embodiment presents a circuit of pulse forming lines for compact linear accelerator that includes an opto-switch and RF transmission lines that form a pulse shaper and a ladder-like pulse multiplier unit, with or without an output shaper.

24 Claims, 7 Drawing Sheets

(56) References Cited

U.S. PATENT DOCUMENTS

| | | | |
|---|---|---|---|
| 7,718,977 B2* | 5/2010 | Gorrell et al. | 250/397 |
| 7,915,763 B1* | 3/2011 | Cargol | 307/106 |
| 7,924,121 B2 | 4/2011 | Caporaso et al. | |
| 8,299,861 B2* | 10/2012 | Tatoian et al. | 331/96 |
| 2008/0128641 A1* | 6/2008 | Henley et al. | 250/492.21 |
| 2009/0261258 A1 | 10/2009 | Harris et al. | |
| 2010/0032580 A1 | 2/2010 | Caporaso et al. | |
| 2012/0126727 A1 | 5/2012 | Hamm | |
| 2012/0146553 A1* | 6/2012 | Joshkin et al. | 315/505 |

OTHER PUBLICATIONS

Caporaso et al., "High Gradient Induction Accelerator," *PAC'07*, Jun. 2007, Albuquerque, New Mexico, pp. 857-861.

Caporaso et al., "Status of the Dielectric Wall Accelerator," *PAC'09*, Vancouver, Canada, May 2009, pp. 3085-3089.

Sullivan et al., "6H-SiC Photoconductive Switches Triggered Below Bandgap Wavelengths," *Power Modulator Symposium and 2006 High Voltage Workshop*, Washington, D.C. 2006, 6 pages.

Sullivan et al., "Wide Bandgap Extrinsic Photoconductive Switches," *IEEE Transactions on Plasma Science*, vol. 36, No. 5, Oct. 2008, pp. 1-5.

Kelkar, "Silicon Carbide as a Photo Conductive Switch Material for High Power Applications," A Dissertation presented to University of Missouri-Columbia, Dec. 2006, pp. 1-126.

Caporaso, "New Trends in Induction Accelerator Technology," *Proceeding of the International Workshop on Recent Progress in Induction Linacs*, Tsukuba, Japan, Dec. 2002, 13 pages.

Caporaso et al., Compact Accelerator Concept for Proton Therapy: *Nuclear Instruments and Methods in Physics Research*, B 261, 2007, pp. 777-781.

Gyawali et al., "Comparative Study of Compensated Wide Band Gap Photo Conductive Switch Material for Extrinsic Mode Operations," *Proceedings of the 2008 IEEE International Power Modulators and High Voltage Conference*, May 27-31, 2008, pp. 5-8.

Trask, "A Tutorial on Transmission Line Transformers," Sonoran Radio Research, Aug. 14, 2005, 7 pages.

"Transmission Line Transformers," www.bytemark.com/products/tlttheory.htm, Aug. 15, 2011, 3 pages.

U.S. Appl. No. 12/963,456 entitled "Blumlein Assembly with Solid States Switch," filed Dec. 8, 2010, 29 pages.

U.S. Appl. No. 13/299,174 entitled "Sub-Nanosecond Beam Pulse Radio Frequency Quadrupole (RFQ) Linear Accelerator System," filed Nov. 17, 2011, 49 pages.

Rukin et al., Ultra-High-Power Repetitive Solid State DBD-Based Switching, *Pulsed Power Plasma Science*, 2001, vol. I, pp. 329-332.

U.S. Appl. No. 13/610,051 entitled "Geometries for Placement of Solid State Switch in a Blumlein Assembly," filed Sep. 11, 2012, 34 pages.

U.S. Appl No. 13/610,069 entitled "Illumination Techniques for Optically Activated Solid State Switch," filed, Sep. 11, 2012, 38 pages.

Jian Qui et al., "A Pulsed Power Supply Based on Power Semiconductor Switches and Transmission Line Transformer," IEEE Transactions on Dielectrics and Electrical Insulation, vol. 14, No. 4, Aug. 2007, pp. 927-930.

Pawelek et al., "Design of a Compact Transmission Line Transformer for High Voltage Nanosecond Pulses," IEEE Transactions on Dielectrics and Electrical Insulation, vol. 14, No. 4, Aug. 2007, pp. 900906.

Notification of Transmittal of the International Search Report and the Written Opinion of the International Searching Authority, or the Declaration for International Application No. PCT/US2013/020478 mailed Jul. 24, 2013, 12 pages.

* cited by examiner

HIGH VOLTAGE RF OPTO-ELECTRIC MULTIPLIER FOR CHARGE PARTICLE ACCELERATIONS

BACKGROUND

1. Field of the Invention

This invention relates generally to linear accelerators and, more specifically, to the circuitry for supplying electrical pulses in such structures.

2. Background Information

Particle accelerators are used to increase the energy of electrically charged atomic particles. In addition to their use for basic scientific study, particle accelerators also find use in the development of nuclear fusion devices and for medical applications, such as cancer therapy. An example is described in U.S. Pat. No. 7,173,385. In order to accelerate the particles, a series of high frequency, high voltage pulse are applied along the axis of the accelerator. The greater the voltage and the greater frequency, the more effective the accelerator. To make such devices more practical, they should also be smaller is size and more efficient. Consequently, there is an ongoing need to make particle accelerators more powerful, more compact, and more efficient.

SUMMARY OF THE INVENTION

According to a first set of general aspects, a compact linear accelerator has one or more opto-electronic multipliers, each having a first electrode and a second electrode, where the multipliers are arranged one upon another alternating the multipliers' first and second electrodes along the axis of the accelerator. Each of the opto-electric multipliers includes a switch section, a pulse shaper, and a multiplier section. The switch section includes a capacitor, having a first terminal connected to receive and store a high voltage and a second terminal connected to ground or shield, and an optically activated switch including a first terminal connected to the first terminal of the capacitor to establish a high voltage gradient across the switch, and connectable to receive an optical signal and, in response to the optical signal, supply an electromagnetic pulse at a second terminal of the switch. The pulse shaper has a first and a second transmission line elements connected to receive the output of the switch section, the first transmission line element connected to provide the output of the pulse shaper. The multiplier section has a plurality of transmission line transformers connected in a ladder-like arrangement, each receiving the output of the pulse shaper as bias voltage input and each transmission line transformer except the first of the ladder receiving as bias voltage input the output of the preceding transmission line transformer in the ladder, the output of the last of the transmission line transformers being connected to the first electrode, wherein the second electrode is connected to ground or shield.

According another set of aspects, a method is presented for providing a high voltage pulse along the axis of a compact particle accelerator. The method includes charging a capacitor from a high voltage source and applying a optical pulse to an optical switch through which the capacitor is connected to a pulse shaping circuit. The switch generates an electromagnetic pulse in response to the optical pulse. The pulse shaping circuit receives the electromagnetic pulse from the switch and shapes the electromagnetic pulse by use of first and second transmission lines connected to receive the output of the switch, the shaped pulse being provided from the first of the transmission lines. The shaped pulse is received and amplified at a multiplying circuit, the multiplying circuit including a plurality of transmission lines connected in a ladder-like arrangement, each receiving the output of the pulse shaper as input and each transmission line except the first of the ladder receiving as a bias input the output of the preceding transmission line in the ladder. The amplified pulse is applied across a pair of electrodes along the axis of the accelerator, wherein the output of the last of the transmission line transformers in the ladder-like arrangement is connected to a first of the electrodes, and a second of the electrodes is connected to the ground/shield of the first transmission line transformer in the ladder like arrangement.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Figure 1:
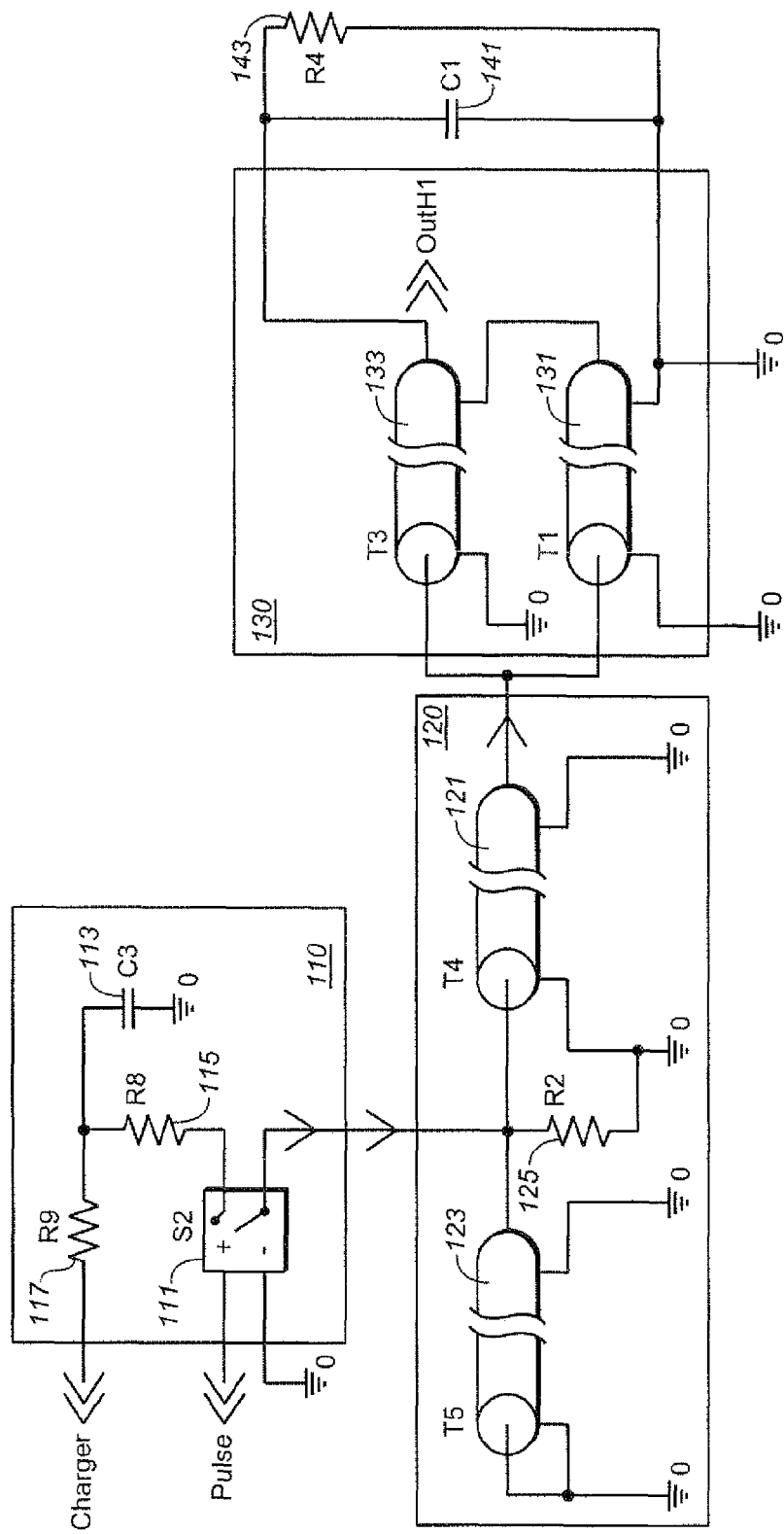
FIG. 1 shows a first exemplary embodiment for high-voltage, radio-frequency multiplier for a charged particle accelerator.

The following presents a number of aspects that can be incorporated in a compact accelerator of charged particles. In particular, it relates to the pulse-forming lines of the linear accelerators and presents devices that can provide high-voltage radio-frequency pulses in the range of from a few volts to megavolts for charged particle accelerators. The devices can use as input an external charge voltage (DC or AC) of, say, charge voltage $U_0$, and an optical pulse to create output RF pulses with a peak voltage of $kU_0$, where k>2 (usually from 4 to 12). The exemplary embodiment presents circuit of pulse forming lines for compact linear accelerator that includes an opto-switch and RF transmission lines that form a pulse shaper and a ladder-like pulse multiplier unit, with or without an output shaper.

The circuitry is able to supply electrical pulse source for charge particle accelerators of high-voltage and of very short duration to multiply the input AC or DC voltage with coefficient of over 2. This results in a compact device capable of providing nanosecond long impulses with voltage peak amplitude in the range from few kV to few MV. Compared to other generators, such as electronic tube devices and blumlein generators, the presented circuitry can be built with a limited number of switches (in the exemplary embodiment, SiC opto-switches). Further, it can be used for producing very high voltage impulses without significant power consumption and, as a result, the power dissipation can be much smaller, using a lower power light beam for triggering.

The exemplary embodiment of the pulse providing circuitry includes three main elements: an opto-switch, a pulse shaper, and a transmission line transformer. The device may also include an output shaper as well, if desired. The switch of the exemplary embodiment can be based on high electrical field assisted optical absorption such as that presented in U.S. patent application Ser. No. 12/963,456. More detail on such a suitable switch is described in: G. Caporaso, "New Trends in Induction Accelerator Technology", Proceeding of the International Workshop on Recent Progress in Induction Linacs, Tsukuba, Japan, 2003; G. Caporaso, et. al., Nucl Instr. and Meth. in Phys. B 261, p. 777 (2007); G. Caporaso, et. al., "High Gradient Induction Accelerator", PAC'07, Albuquerque, June 2007; G. Caporaso, et. al., "Status of the Dielectric Wall Accelerator", PAC'09, Vancouver, Canada, May 2009; J. Sullivan and J. Stanley, "6H—SiC Photoconductive Switches Triggered Below Bandgap Wavelengths", Power Modulator Symposium and 2006 High Voltage Workshop, Washington, D.C. 2006, p. 215 (2006); James S. Sullivan and Joel R. Stanley, "Wide Bandgap Extrinsic Photoconductive Switches" IEEE Transactions on Plasma Science, Vol. 36, no. 5, October 2008; and Gyawali, S. Fessler, C. M. Normally, W. C. Islam, N. E., "Comparative Study of Compensated Wide Band Gap Photo Conductive Switch Material for Extrinsic Mode Operations", Proceedings of the 2008 IEEE International Power Modulators and High Voltage Conference, 27-31 May 2008, pp. 5-8.

FIG. 1 shows a first exemplary embodiment that illustrates some of the main principles. A pulse shaper 120 provides its output to the ladder-like element 130 and on to the electrodes of a stage of the accelerator, here represented in terms of its capacitance C1 141 and resistance R4 142. The electromagnetic pulse to be shaped is supplied from switch module 110. The switch module is here represents an electrical model S2 111 of the opto-switch, such as that of the references of the last paragraph above, where as a pulse from a light source (such as a laser) is applied to the switch it will pass a voltage pulse to the shaper 120. The input voltage is supplied at the input labeled Charger and to the capacitor C3 113 connected between the voltage input and ground/shield for the device, which then supplies the high voltage input to the switch S2 111. The shown resistances (R9 117, R8 115) include the switch resistances for the devices. When a pulse is then applied from a light source to the switch, it then passes an electrical pulse on to the shaper 120. The pulse can be supplied to the switch along one or more optical fibers from a laser or other light source, such as described in U.S. patent application Ser. No. 12/963,456.

(Unless particularly specified, here "ground", "shield", or "ground/shield" will be largely used interchangeably to refer to the lower voltage level of the circuits involved. In embodiments based on coaxial transmission lines, this electrode or lead is typically referred to as "shield", while for micro-strips they are usually called ground. As noted below, depending on the embodiment, the described devices can be based on coaxial transmission lines or micro-strips, or combinations of these. Also, dependent the embodiment, the level used could be a zero bias ground voltage or they may be biased at a higher level, perhaps very high such as half of the output.)

Pulse shaper 120 is formed of a pair transmission lines T4 121 and T5 123 whose inputs are connected together to receive the output of the switch module and connected to ground/shield through the resistor R2 125. The transmission line elements T5 123 and T4 121 can be formed of coaxial cable or micro-strip transmission lines. On the other side, the signal strip/core input of T5 123 is connected to ground and that of T4 121 will supply the shaped output. Both lines have their second, outer ground lead connected to ground. The electromagnetic pulse received from switch S2 111 produces two electromagnetic waves or pulses running to the output of the transmission lines T4 121 and T5 123. The transmission line T5 123 has a shorted output. The transmission line t4 121 has its output connected to the transmission line transformer elements in the multiplier section 130. Once the wave in T5 123 reaches end of the transmission line, it reflects from the end, changes polarity and runs into the transmission line T4 121. The reflected pulse of T5 123 terminates the pulse in the second transmission T 121. This provides a sharp rear side pulse into transmission line transformers of the ladder-like arrangement 130, where the details of the shaped pulse can be altered by adjusting the optical pulse's duration and the length of the transmission lines.

Figure 3:
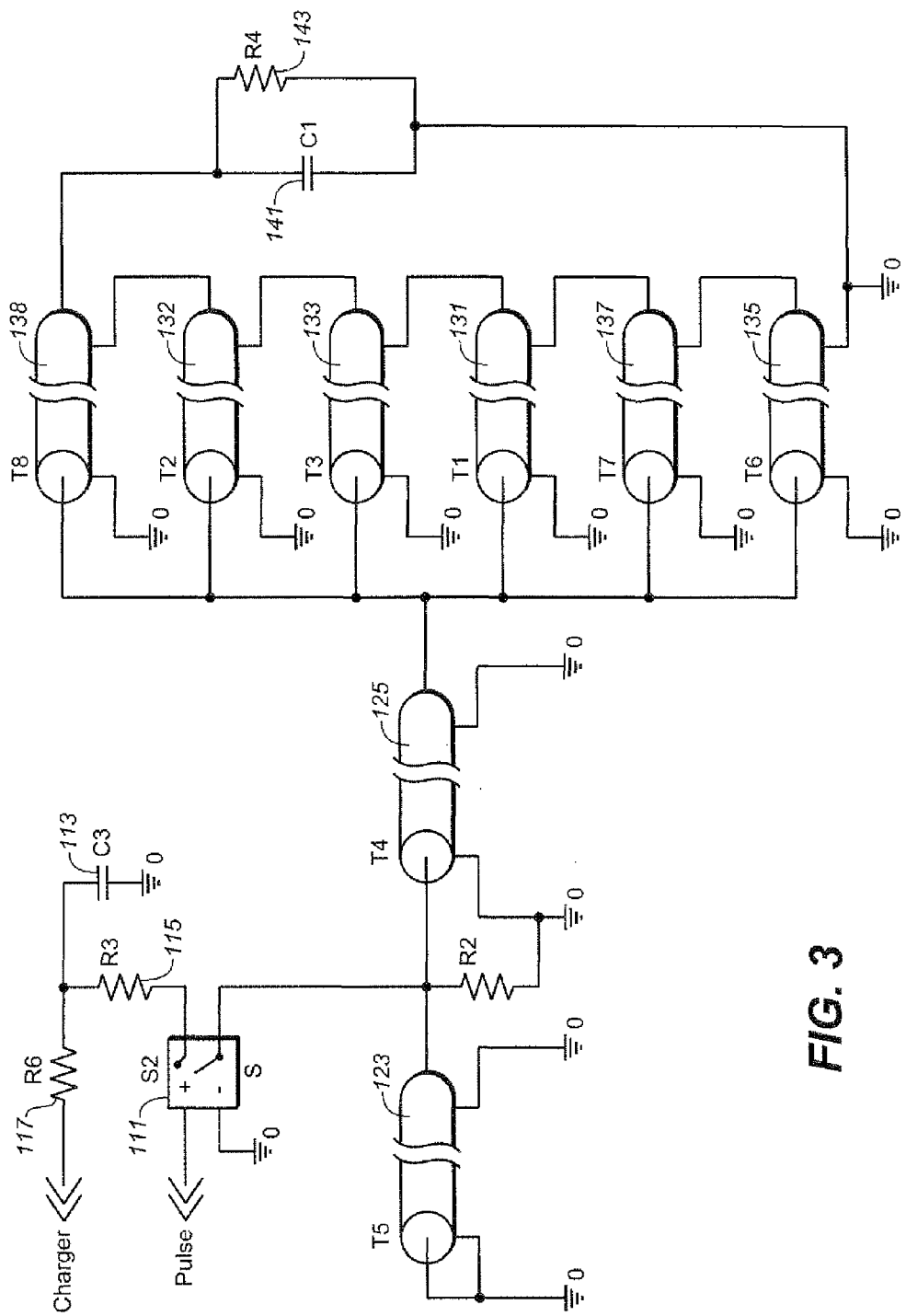
FIG. 3 shows another exemplary embodiment for a high-voltage, radio-frequency multiplier for a charged particle accelerator having a six stage ladder-like multiplier.

The multiplier section is a transmission line transformer (see, for example, Jerry Sevick, "Transmission line transformers" 4$^{th}$ edition, Scitech Publishing, Inc.). FIGS. 1 and 3 present one of possible designs for transmission line transformer. Here; the voltage multiplication is produced by the ladder-like elements, here two, that can be connected as a transmission line T1 131 connected to the transmission line T3 133. Both of T1 131 and T3 133 can again be formed of a coaxial cable or micro-strip and both have their signal strip/core connected to receive the shaped pulse from the shaper 120. The first rung on the ladder, T1 131, has the other end of its signal strip/core connected to the second, ground lead of T3 133, whose other end is in turn connected to ground (or shield) of the device. T1 131 has both ends of its ground lead grounded. The output of multiplier 131 is from the other side of signal strip/core lead of T3 132 and is then connected to the electrodes of the accelerator, here represented by the corresponding capacitance C1 141 and resistance R4 143. The larger the number of ladder line elements, the larger the multiplication coefficient of the device. The output of the multiplier circuit 139 can be connected directly to the output (accelerator) or through an output shaper, if desired, which could be formed of transmission line impedances similarly to the shaper 120, which can provide better shape for the output signal and also multiply by 2 the output.

Figure 2:
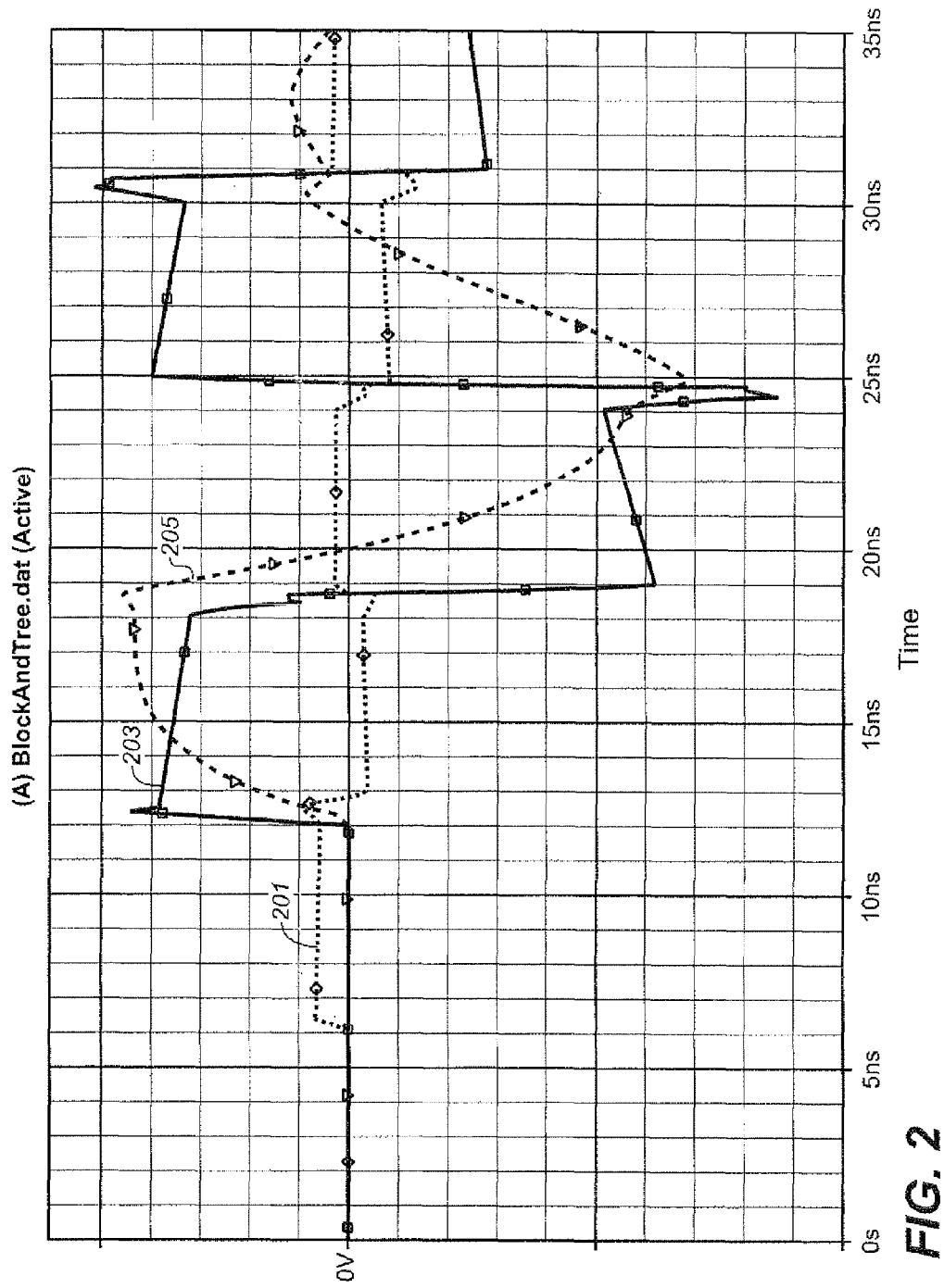
FIG. 2 shows shapes and amplitudes for the output signal of an exemplary multiplier circuit.

FIG. 2 shows different shapes and amplitudes for the output signal for the scheme with four ladder-like elements, as simulated with PSPICE. The amplification coefficient is more than four and depends on the load capacitance (C1 141 in FIG. 1). For the dielectric wall accelerator this capacitor can typically be in 2 pF to 16 pF range. (More detail on the dielectric wall type accelerator is described in U.S. Pat. No. 5,757,146, where it is formed out of one or more Blumlein structures.) In FIG. 2, 201 is an output signal of the shaper 120 and 203 is the corresponding output signal for the multiplier section 130 with open output. The pulse seen along the axis of the accelerator from the electrodes is then 205. The multiplication coefficient of this is about four. Voltage amplitude is shown in arbitrary units; for example, the multiplier output signal with peak amplitude of ~22 kV is expected for a shaper pulse of about 5 kV.

FIG. 3 presents HV RF multiplier with 6 ladder-like elements. The labeling corresponds to that of FIG. 1, except that now that the multiplier section has the six transmission line transformers (or TLTs) T1 131, T2 132, T3 133, T6 136, T7 137, and T8 138. T8 138 now supplies the output (as did T3 133 in FIG. 1) and T5 135 is now the bottom rung (as was T1

131 in FIG. 1), but there are now connected through the four intermediates transmission line impedances. All six have the shaped pulse as their input on one side of the signal strip/core, with the other side connected to the second (or ground) lead of the next rung, aside from the last (T8 138) that provides the output. All rungs have the other side of the second lead connected to ground, as is the other end of this lead for the first rung T5 135.

Figure 4:
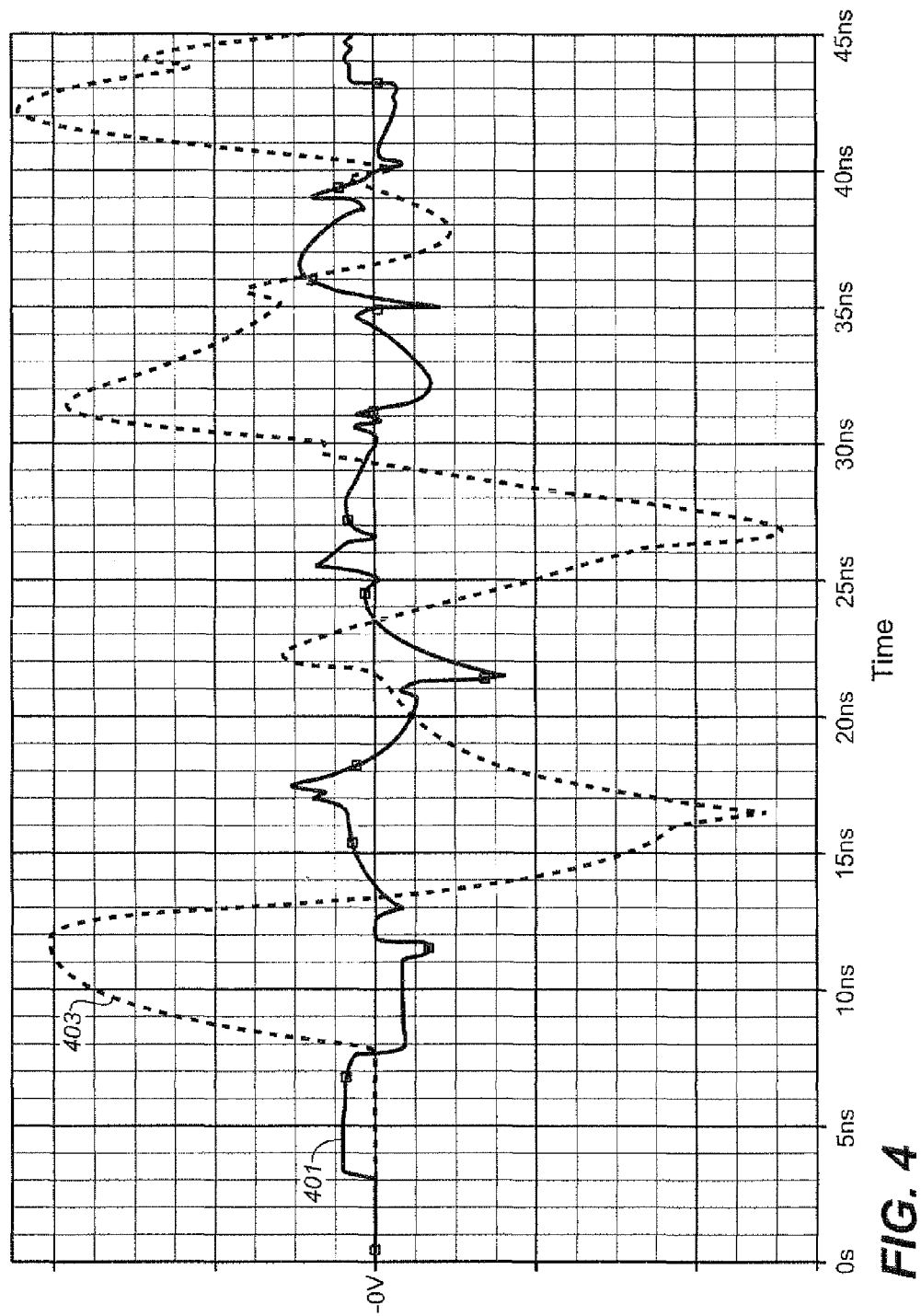
FIG. 4 is a set of waveforms corresponding to the embodiment of FIG. 3.

FIG. 4 shows waveforms corresponding to the 6 step ladder embodiment of FIG. 3. The show simulation is for an embodiment with a load capacitance C1 141 of 4 nF, a 12 Ohm impedance shaper, 75 Ohm ladder-like elements, and a 3 pF charge capacitor C3 113. The waveform 403 corresponds to the output voltage of the multiplier and 401 is output of the opto-switch 111. The multiplication factor of this arrangement is ~8 and the voltage amplitudes are shown in arbitrary units.

The exemplary embodiments use transmission line transformers with ferrite, resulting in a narrow band device. As a result, it is possible to use delayed break down devices instead of the opto-switch for the HV RF multiplier. More information on breakdown devices can be found in Rukin, S. N.; Alichkin, E. A.; Lyubutin, S. K.; Mesyats, G. A.; Slovikovsky, B. G., "Ultra-high-power repetitive solid state DBD-based switching", Pulsed Power Plasma Science, 2001, pp. 329-332, vol. 1.

A number of factors affect the HV RF multiplier's performance. One of these is the transmission line impedances (for the transmission lines of the shaper and ladder-like elements, as well as for an output shaper, if included) and their lengths (transmission time). Another factor is the output lead impedance, especially the capacitance. The charge capacitance (C3 113 of the switch module in FIGS. 1 and 3) the switch module and the pulse duration applied to the switch are also important factors.

Figure 5:
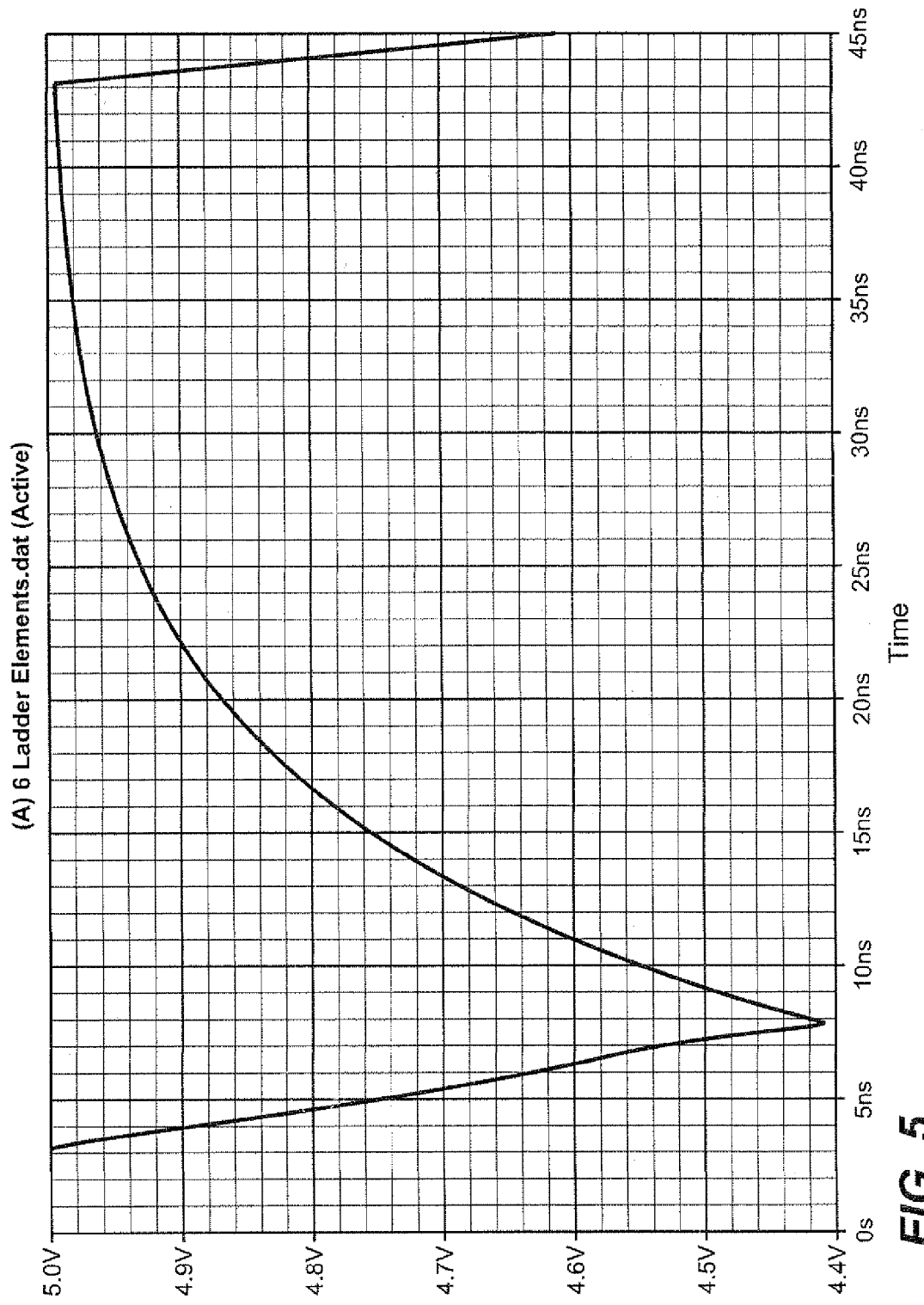
FIG. 5 shows the variation of the voltage on the switch module's high voltage charge capacitor for the embodiment of FIG. 3.

On advantage of the arrangement presented here is that the charge capacitance C3 113 is not discharged completely when the switch is in on-state (illuminated with light). FIG. 5 shows the variation of the voltage on the switch module's high voltage charge capacitor for the HV RF multiplier with 6 ladder-like elements. The small relative drop of voltage at the charge capacitor (~10-15%) can provide a power saving during operation. In many applications, this can be a very important feature of the circuit presented here and it can give a significant advantage for this type of HV RF multiplier over other well-known HV RF generator approaches, such a Blumlein approach as in U.S. Pat. No. 7,173,385.

Figure 6:
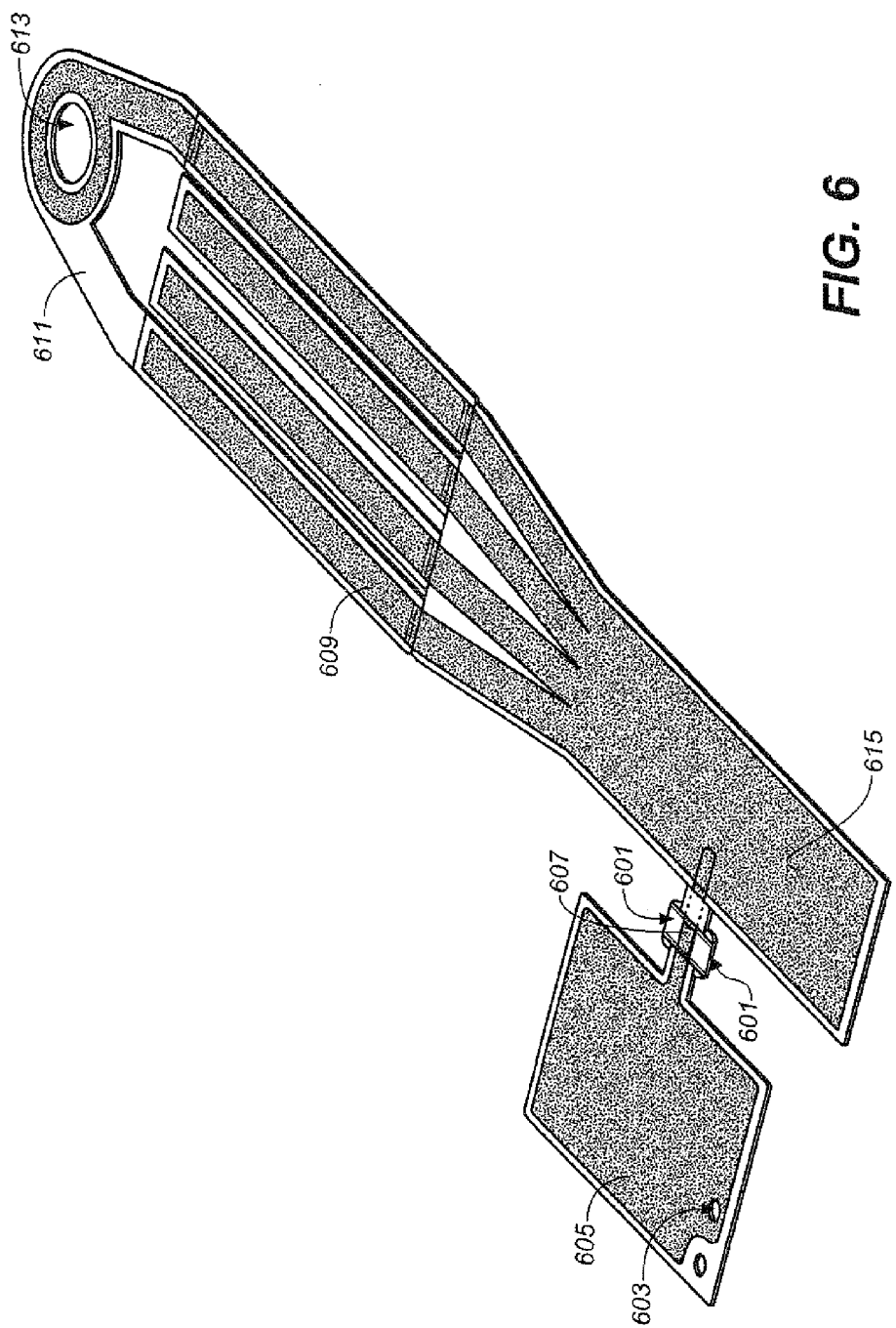
FIG. 6 shows a planar "micro-strip" implementation for the circuit.

FIG. 6 is a drawing showing how a HV RF opto-electronic multiplier circuit such as in FIG. 1 or 3, but with now with four ladder-like elements, as laid out for an accelerator, here implemented as a planar "micro-strip" version of the design. At 601 are the fiber input port (or ports) at which the light pulse is supplied to the switch from a laser or other light source (not shown in the figures). A high voltage DC input is at 603, where it supplied to the capacitor 605 (corresponding to C3 113 in FIGS. 1 and 3). The opto-switch is at 607. The ladder-like elements of the transmission line transformers are at 609, where the details of their connects is as in FIGS. 1 and 3, which are then have their output connected to the load 611. This load 611 is the high voltage electrodes of accelerator, where these each form an annulus along the axis of accelerator for the charged particle beam 613. The pulse shaper 615 is then connected between the switch 607 and the multiplier section 609.

Figure 7:
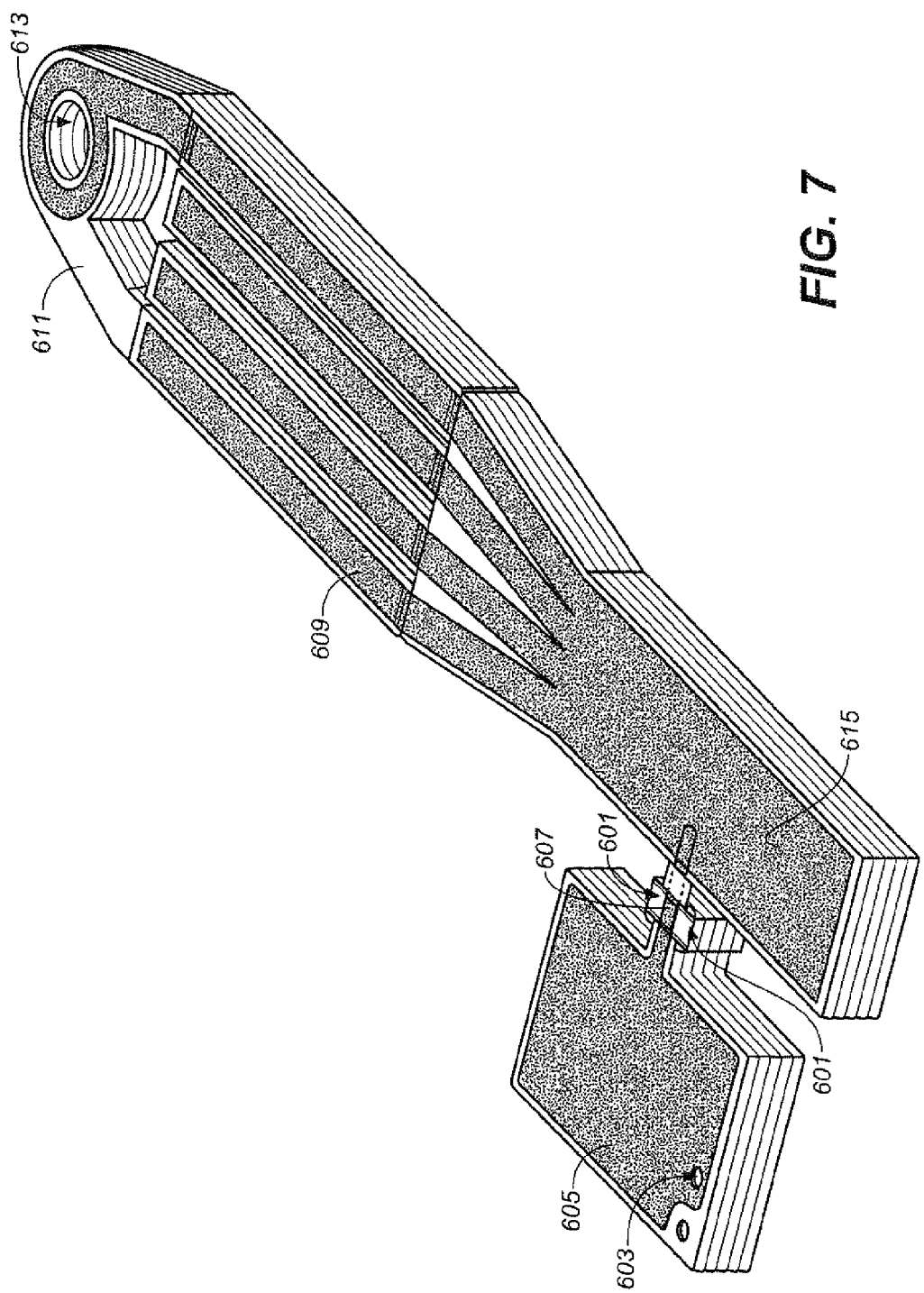
FIG. 7 shows a stack of HV RF opto-electronic multipliers as arranged to form an accelerator.

FIG. 7 shows a stack of HV RF opto-electronic multipliers as arranged to form the accelerator, the top-most being labeled as in FIG. 6. The electrodes of the layers of the stack alternate between the high and ground or shield electrodes along the acceleration axis of the accelerator 613. The pulses of input optical pulses of each layers switch are then timed to provide the desired acceleration profile. The particles would then be provided at one end from a beam source such as that presented in U.S. provisional patent application No. 61/415,646, filed on Nov. 19, 2010.

The exemplary embodiment of FIGS. 6 and 7 has four ladder-like elements, where the output high voltage of one being connected to the ground of next as shown in FIGS. 1 and 3 for 2 and 4 rungs, respectively. The number of rungs in the ladder, the number of stages (layers in FIG. 7) in the accelerator, and other variables (such as an output shaper) are a design choice that needs to balance the various requirements. For example, having more ladder-like elements in each stage will increase the voltage amplification of that stage, but will increase the drop down time and each additional rung becomes less effective and the pulse shape may deteriorate, so that it becomes a case of diminishing returns. Consequently, for a given desired output of the accelerator, it may be more efficient to have more stages with variable switching schedule to realize a traveling wave device rather than more rungs in the ladders of each stage.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A compact linear accelerator, comprising:
one or more opto-electronic multipliers, each having a first electrode and a second electrode, the multipliers arranged one upon another alternating the multipliers' first and second electrodes along the axis of the accelerator, each of the opto-electric multipliers including:
a switch section, having:
  a capacitor having a first terminal connected to receive and store a high voltage and a second terminal connected to ground/shield; and
  an optically activated switch including a first terminal connected to the first terminal of the capacitor to establish a high voltage gradient across the switch, and connectable to receive an optical signal and, in response thereto, supply an electromagnetic pulse at a second terminal of the switch;
a pulse shaper having a first and a second transmission line elements connected to receive the output of the switch section, the first transmission line element connected to provide the output thereof; and
a multiplier section having a plurality of transmission line transformers connected in a ladder-like arrangement, each receiving the output of the pulse shaper as bias voltage input and each transmission line transformer except the first of the ladder receiving as bias voltage input the output of the preceding transmission line transformer in the ladder, the output of the last of the transmission line transformers being connected to the first electrode, wherein the second electrode is connected to ground/shield.

2. The compact linear accelerator of claim 1, wherein the switch includes a semiconductor crystal having the first and second switch terminals.

3. The compact linear accelerator of claim 1, wherein each of the first and second electrodes are in the form of an annulus centered along the axis of the accelerator.

4. The compact linear accelerator of claim 1, wherein the transmission line elements of the pulse shaper and the transmission line transformers of the multiplier section are formed of coaxial cables.

5. The compact linear accelerator of claim 1, wherein the transmission line elements of the pulse shaper and the transmission line transformers of the multiplier section are formed of micro-strip transmission lines.

6. The compact linear accelerator of claim 1, wherein the first transmission line element of the pulse shaper has a signal strip/core connected between the second terminal of the switch section and the output of the pulse shaper and a ground/shield lead connected to ground/shield, and wherein the second transmission line element of the pulse shaper has a signal strip/core connected between the output of the switch section and ground/shield and a ground/shield lead connected to ground/shield.

7. The compact linear accelerator of claim 1, wherein each of the transmission line transformers of the multiplier section has a signal strip/core input and a ground/shield lead, the a signal strip/core input of each transmission line transformer except the last being connected between the output of the pulse shaper and the ground/shield lead of the subsequent transmission line transformer, the ground/shield lead of each transmission line transformer being connected between ground/shield and the a signal strip/core input of the preceding transmission line transformer, the signal strip/core input of the last transmission line transformer being connected between the output of the pulse shaper and the first electrode, and the ground/shield lead of the first transmission line transformer being connected to ground/shield.

8. The compact linear accelerator of claim 1, wherein the switch includes one or more ports for the connection of an optical fiber thereto.

9. The compact linear accelerator of claim 8, further comprising a corresponding one or more optical fibers connected to each of the ports to receive an optical pulse from a light source.

10. The compact linear accelerator of claim 9, wherein the light source is a laser.

11. The compact linear accelerator of claim 1, further comprising:
an output shaping circuit, through with the multiplier section is connected to the first electrode.

12. The compact linear accelerator of claim 11, wherein the output shaping circuit is formed of transmission line elements.

13. A method of providing a high voltage pulse along the axis of a compact particle accelerator, comprising:
charging a capacitor from a high voltage source;
applying a optical pulse to an optical switch through which the capacitor is connected to a pulse shaping circuit;
generating an electromagnetic pulse by the switch in response to the optical pulse;
receiving the electromagnetic pulse from the switch at the pulse shaping circuit and shaping the electromagnetic pulse by use of first and second transmission lines connected to receive the output of the switch, the shaped pulse being provided from the first of the transmission lines thereof;
receiving and amplifying the shaped pulse at a multiplying circuit, the multiplying circuit including a plurality of transmission lines connected in a ladder-like arrangement, each receiving the output of the pulse shaper as input and each transmission line transformer except the first of the ladder receiving as a bias input the output of the preceding transmission line transformer in the ladder; and
applying the amplified pulse across a pair of electrodes along the axis of the accelerator, wherein the output of the last of the transmission line transformers in the ladder-like arrangement is connected to a first of the electrodes, and a second of the electrodes is connected to the ground/shield of the first transmission line transformer in the ladder like arrangement.

14. The method of claims 13, wherein the inputs of the first and second transmission line impendences of the pulse shaping circuit are connected together and the second transmission line impendence has a shorted output, and wherein shaping the electromagnetic includes receiving the electromagnetic pulse at the inputs of the first and second transmission line impendences, reflecting in the second transmission line impendence the wave generated therefrom with reversed parity, and transmitting the reflected wave from the second transmission line impendence into the first transmission line impendence.

15. The method of claim 13, wherein the optical switch includes a semiconductor crystal having the first and second switch terminals.

16. The method of claim 13, wherein each of the pair electrodes are in the form of an annulus centered along the axis of the accelerator.

17. The method of claim 13, wherein the transmission lines of the pulse shaping circuit and the multiplying circuit are formed of coaxial cables.

18. The method of claim 13, wherein the transmission lines of the pulse shaping circuit and the multiplying circuit are formed of micro-strip transmission lines.

19. The method of claim 13, wherein each of the transmission lines of the multiplying circuit has a signal strip/core input and a ground/shield lead, the a signal strip/core input of each transmission line except the last being connected between the output of the pulse shaper and the ground/shield lead of the subsequent transmission line, the ground/shield lead of each transmission line being connected between ground/shield and the a signal strip/core input of the preceding transmission line, the signal strip/core input of the last transmission line being connected between the output of the pulse shaper and the first electrode, and the ground/shield lead of the first transmission line being connected to ground/shield.

20. The method of claim 13, wherein the optical switch includes one or more ports for the connection of an optical fiber thereto through which the optical pulse is applied.

21. The method of claim 20, further comprising generating the applied optical pulse from a light source.

22. The method of claim 21, wherein the light source is a laser.

23. The method of claim 13, further comprising:
supplying the amplified pulse from the multiplying circuit to the electrodes though an output shaping circuit.

24. The method of claim 23, wherein the output shaping circuit is formed of transmission line elements.

* * * * *